United States Patent
Millar et al.

(10) Patent No.: US 11,346,932 B1
(45) Date of Patent: May 31, 2022

(54) FREQUENCY MODULATED IMAGE RECONSTRUCTION

(71) Applicant: Mitsubishi Electric Research Laboratories, Inc., Cambridge, MA (US)

(72) Inventors: David Millar, Concord, MA (US); Pu Wang, Cambridge, MA (US); Kieran Parsons, Cambridge, MA (US); Philip Orlik, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 751 days.

(21) Appl. No.: 16/226,723

(22) Filed: Dec. 20, 2018

(51) Int. Cl.
| | |
|---|---|
| *G01C 3/08* | (2006.01) |
| *G01S 13/34* | (2006.01) |
| *G01S 7/35* | (2006.01) |
| *G01B 9/02002* | (2022.01) |
| *H03B 23/00* | (2006.01) |
| *G01S 17/26* | (2020.01) |
| *G01S 17/34* | (2020.01) |

(52) U.S. Cl.
CPC .......... *G01S 13/34* (2013.01); *G01B 9/02005* (2013.01); *G01S 7/352* (2013.01); *G01S 17/26* (2020.01); *H03B 23/00* (2013.01); *G01S 17/34* (2020.01)

(58) Field of Classification Search
None
See application file for complete search history.

(56) References Cited

U.S. PATENT DOCUMENTS

| 7,652,616 B2 * | 1/2010 | Inaba | G01S 13/34 342/70 |
| 2019/0129016 A1 * | 5/2019 | Halmos | G01S 17/32 |

FOREIGN PATENT DOCUMENTS

JP      2008170323 A * 7/2008 ............. G01S 13/93

* cited by examiner

*Primary Examiner* — Mark Hellner
(74) *Attorney, Agent, or Firm* — Gennadiy Vinokur; Hironori Tsukamoto

(57) ABSTRACT

A system for a target image reconstruction includes a stepped frequency transmitter configured to emit a stepped frequency waveform having different constant frequencies at different periods of time and a modulator configured to modulate the stepped frequency waveform emitted at each period of time with a modulation signal to output a modulated stepped frequency waveform with an increased bandwidth. The system includes a transceiver configured to transmit the modulated stepped frequency waveform to a target and to accept reflection of the modulated stepped frequency waveform reflected from the target, a mixer to interfere the unmodulated stepped frequency waveform and the reflection of the modulated stepped frequency waveform to produce a beat signal of the interference of the unmodulated stepped frequency waveform with the reflection of the modulated stepped frequency waveform, and a signal processor to reconstruct an image of the target from the beat signal.

18 Claims, 17 Drawing Sheets

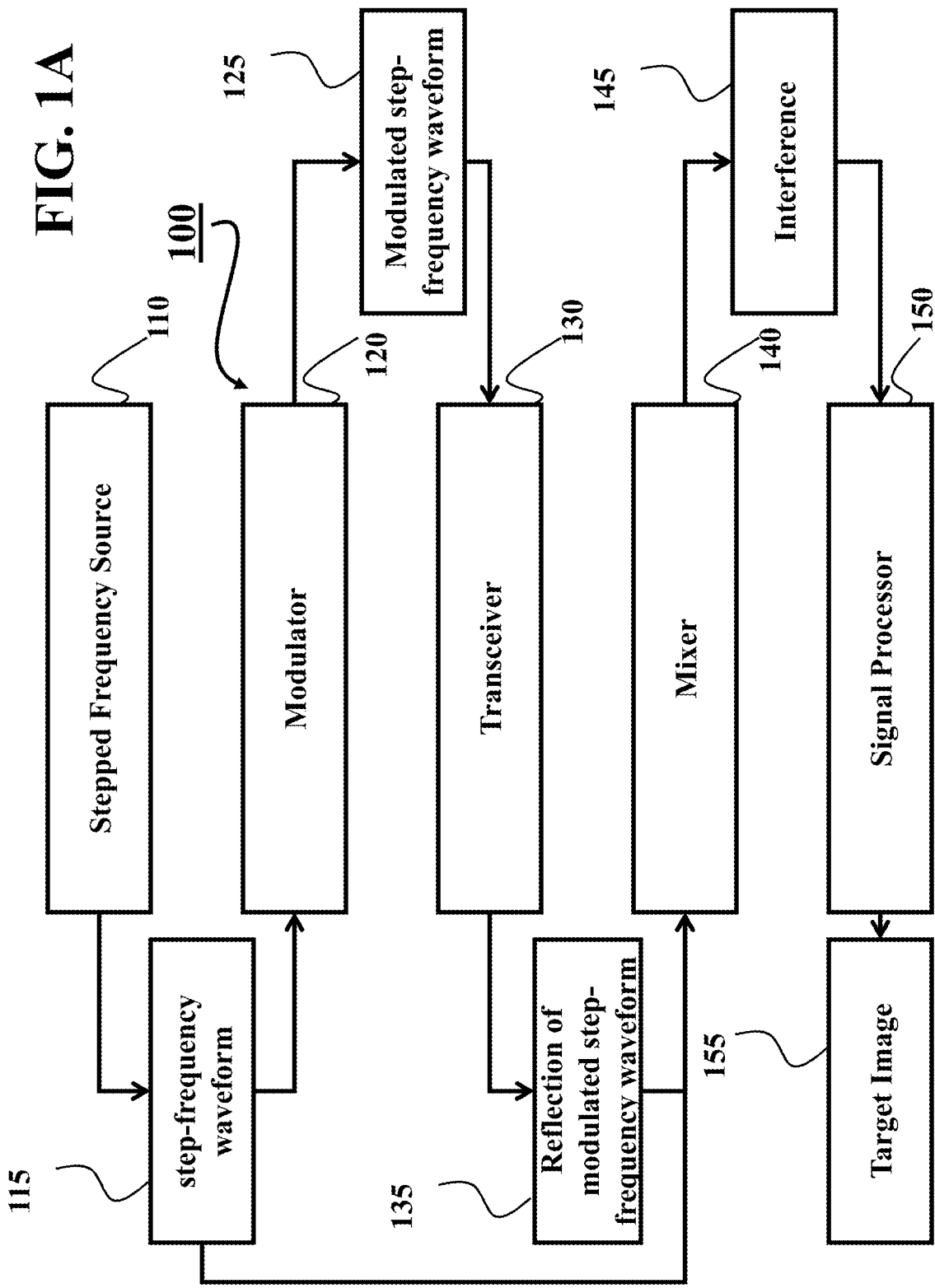

FREQUENCY MODULATED IMAGE RECONSTRUCTION

TECHNICAL FIELD

This invention relates generally to sensing, frequency modulation, and particularly image reconstruction using frequency modulated signal.

BACKGROUND

Linearly swept source in sonic, radio and optical frequency ranges have been used to estimate the range (distance) of reflectors with high resolution, low hardware cost, and lightweight signal processing. Frequency modulation continuous wave (FMCW) radar, optical frequency-domain reflectometry (OFDR) and swept source optical coherence tomography (SS-OCT) are typical applications of linear swept sources. The FMCW-based sensing systems can estimate the range to reflectors. Linearly swept source is also used by coherent optical sensors for constructing 3-D images of objects for applications such as medical imaging, and industrial imaging.

For example, FMCW radar transmits linearly frequency-modulated continuous waves, whose frequency pattern follows a saw tooth or triangular pattern with respect to time. Reflected signals from various objects of interest are mixed with the local oscillator signal, which is used to generate the transmitted signal, to produce analog beat signals and output digital beat signals via analog-to-digital converters (ADCs). Since the frequency of the beat signal is proportional to the distance of object, a standard fast Fourier transform (FFT) of the beat signal can be used to identify peaks and estimate the distance. In the case of moving objects, the frequency of beat signal also depends on the radial velocity between the FMCW radar and object. This velocity can be estimated by a second FFT across multiple linear FM scans.

An OFDR interferometer, similarly, provides beat signals that are produced by the optical interference between two light signals: one reference signal originates from a linearly chirped highly-coherent light source and the other is from reflection or backscattering light from an optical path of a fiber under test. The resulting interference signal is collected as a function of optical frequency of a tunable laser source (TLS). An FFT is then used to convert this frequency domain information to spatial information.

Similarly, SS-OCT employs linearly frequency-swept laser to provide high accuracy range solution measurements for imaging applications. With a tunable laser source that scans through a wide range of frequencies with fast sweeping speed and narrow instantaneous linewidth, SS-OCT acquires all range information in a single axial scan from the frequency spectrum of the interference signal between reflected light signal and a stationary reference signal.

One common issue related to sensing with linearly swept sources is that the range resolution degrades when the swept source is not completely linearly modulated. The source nonlinearity can be due to nonlinear tuning and phase noise of the laser source, impairments of low-cost voltage controlled oscillator (VCO), and temperature sensitivity of laser source. The non-linearity results in spectrum spreading of beat signals and, hence, deteriorates the spatial resolution and sensitivity. The nonlinearity effect is also range dependent: smaller at short measurement distances and greater at long measurement distances.

State-of-art computational methods use a known reference branch to achieve nonlinearity correction. Specifically, the unknown non-linearity of the modulated source causes the unknown shift in the range estimation, making the entire estimation system underdetermined. To that end, some systems use a dedicated path of a known distance to eliminate at least one unknown from the range estimation and to estimate the non-linearity of the modulation. However, making use of the dedicated path requires additional hardware resources, which is undesirable for some applications.

Another limitation of sensors employing linearly swept sources is that their resolution is limited by the bandwidth of the linearly swept source used to illuminate the object. Producing a linearly ideal swept source covering high bandwidth is challenging and expensive. Conventional sensors use either randomly varying high bandwidth sources combined with multiple detectors, or time-varying high bandwidth sources which sweep in the frequency domain, combined with a single receiver. Both of these solutions lead to high resolution, but have extremely high cost due to the complexity of manufacturing the detectors in the former case, and the source in the latter case.

SUMMARY

It is an object of some embodiments to provide a sensor configured to reconstruct an image of a scene from a frequency modulated signal reflected from target(s) in the scene. Such an image is referred herein as a target image. It is an object of some embodiments to provide such a sensor that uses a functionality of linearly swept sources that emit linearly swept waveforms in a frequency domain without cost of manufacturing the ideal linearly swept sources and/or imperfection caused by non-linearity in practical implementation of current linearly swept sources. It is an object of some embodiments to increase bandwidth of such swept sources without unproportionally high increase of cost of manufacturing typically associated with high bandwidth swept sources.

On one hand, these objectives seem too optimistic. However, some embodiments aim to replace a linear swept source with a stepped frequency swept source, because stepped frequency swept source can cover virtually arbitrarily high bandwidth either without any cost increase associated with increase of the bandwidth or with moderate cost increase. However, in order to use a stepped frequency swept source in frequency modulated image reconstruction, some embodiments overcome a number of challenges.

First, some embodiments are based on understanding that a stepped frequency swept source by itself is not suitable for frequency modulated image reconstruction. A stepped frequency swept source emits waveform having different constant frequencies at different periods of time, but only a single frequency for each period of time. In essence, a waveform emitted by a stepped frequency swept source is a stepped frequency waveform that can be represented by a stepped function, which is a piecewise constant function having only finitely many pieces. Because of these properties, only a small number of frequencies in the covered bandwidth are defined (have values), which degrade the image reconstruction.

Some embodiments are based on realization that each constant frequency of a stepped frequency waveform can be modulated to increase its bandwidth. In effect, such modulation spreads the constant frequency to completely occupy a range of the bandwidth that includes that constant frequency. Each constant frequency after modulation can be represented by a range function that returns each value of the frequency within a range. If the modulation function is properly selected, the modulated stepped frequency waveform occupies the entire bandwidth between the lowest and the highest constant frequencies of the stepped frequency waveform.

In one embodiment, the stepped frequency waveform has a constant height for each step, such that the difference between any two neighboring frequencies is constant. In this embodiment, a single modulator configured to spread a constant frequency over a range defined by the step of the stepped frequency waveform can modulate the entire stepped frequency waveform to occupy the entire bandwidth. In such a manner, a single stepped frequency swept source (which can be implemented with multiple constant frequency sources) and a single modulator can produce a modulated signal that covers virtually arbitrarily large bandwidth.

In such a manner, a combination of stepped frequency transmitter and a modulator can increase bandwidth of the transmitted signal without an unproportionally high increase of the cost of the transmitter. However, in order to use the modulated stepped frequency waveform in image reconstruction, there is a need to change the principles of image reconstruction from reflection of transmission of frequency modulated signals. Typically, the ideal swept source calls for target image reconstruction from the interference of the transmitted and reflected signals. The reason for that is when the ideal linear swept source is used, at each instance of time there is a one-to-one correspondence between this interfered signal and Fourier transform of the target image allowing for the target image reconstruction. However, in contrast with the ideal linear swept source, the modulated stepped frequency waveform transmitted to the target does not have this one-to-one mapping as the frequency values of the modulated signal spectrum are not linearly increasing in time. To that end, the recovery of the target image from an interference of the signal modulated from the stepped frequency signal and its reflection from the target can be an ill-posed or underdetermined problem.

Some embodiments are based on realization that the target image can be reconstructed from the reflection of transmitted modulated stepped frequency waveform based on interference of the reflection of the modulated stepped frequency waveform with a single value waveform that has only a single value of frequency at each point of time. Notably, in such a manner, the target image is reconstructed not from the interference of the transmitted and received waveforms, but from the interference of received waveform with some other different (not transmitted) waveform. However, an interference of an arbitrarily single value waveform with the reflection of the modulated stepped frequency waveform can pose high bandwidth requirements on an interferometer due to potential large difference in bandwidths between the modulated stepped frequency waveform and a single value waveform. This high bandwidth requirement of an interferometer can undesirably increase the cost of the sensor.

Some embodiments are based on realization that an unmodulated stepped frequency waveform is a single value waveform that mimics the frequency change of the reflected stepped frequency waveform. Thus, an interference of the unmodulated stepped frequency waveform and the reflection of the modulated stepped frequency waveform can be performed with a single interferometer having a bandwidth comparable with the frequency step of the stepped frequency waveform.

Accordingly, some embodiments reconstruct the target image not from the interference of transmitted and received signals, but from the interference of unmodulated (but not transmitted signal) and the reflected signal. Specifically, some embodiments detect an interference of the interference of unmodulated (but not transmitted) stepped frequency waveform and the reflection from transmission of modulated stepped frequency waveform and deconvolve the received modulation signal from the received interference to form an inferred target spectrum, and reconstruct the target image from the target spectrum.

Accordingly, one embodiment discloses a sensor including a stepped frequency transmitter configured to emit a stepped frequency waveform having different constant frequencies at different periods of time; a modulator configured to modulate the stepped frequency waveform emitted at each period of time with a modulation signal to output a modulated stepped frequency waveform with an increased bandwidth; a transceiver configured to transmit the modulated stepped frequency waveform to a target and to accept reflection of the modulated stepped frequency waveform reflected from the target; a mixer to interfere the unmodulated stepped frequency waveform and the reflection of the modulated stepped frequency waveform to produce an interference; and a signal processor to reconstruct an image of the target from the interference.

Some embodiments are based on another realization that each step frequency of the modulated stepped frequency waveform can be processed separately. This is advantageous because this enables the use of arbitrarily many lasers with an arbitrarily high combined bandwidth. An individual target image reconstruction for each step frequency produces a low resolution of a target image corresponding to a small bandwidth of modulation of corresponding step frequency. However, these low resolution target images for different step frequencies can be combined together in a frequency domain to increase a resolution of the target image. To that end, some embodiments measure multiple of inferred target spectra, with different frequencies of unmodulated stepped frequency waveform and construct an inferred spectrum including the information from all of the inferred target spectra. By joining these spectra together in the frequency domain, some embodiments construct a ptychographic super-resolution image of the target.

For example, in one embodiment, the signal processor is configured to reconstruct a low-resolution image for each step frequency of the unmodulated step frequency waveform to produce a set of low-resolution images, transform the set of low-resolution images with a Fourier transform to produce a set of Fourier transformations, join the set of Fourier transformations with respect to their corresponding step frequencies to produce a joined Fourier transformation; and inverse Fourier transform of the joined Fourier transformation to produce the target image with a resolution higher than the low-resolution of the low-resolution images.

Some embodiments are based on another realization that the knowledge of parameters of modulation can be useful for target image reconstruction. Specifically, a waveform reflected from a target is affected by a number of processes including a processes of interest and ancillary processes. The process of interest is a reflection from the target image. This process affects the waveform in a manner allowing reconstructing the target image. The ancillary processes include a manner of generation of the waveform and modulation of the waveform. The effect of generation is reduced by interfering the reflection of the modulated step frequency waveform and the original and unmodulated step frequency waveform. However, there is also a need to consider the effects of modulation during the target image reconstruction.

Parameters of modulations have different principles than the principles of propagation of processed waveforms. Hence, it can be difficult to consider those parameters directly in the target image reconstruction. However, some embodiments are based on realization that one way to consider the modulation in target image reconstruction is by interfering the unmodulated and modulated step frequency waveforms allowing to receive the parameters of modulation in a form similar to the form of the process waveforms. This second interference can help to separate effects of modulation on the reflection of the modulated stepped frequency waveform.

For example, in one embodiment, the sensor includes two interferometers. First interferometer is arranged to beat unmodulated step frequency waveform and a reflection of the modulated step frequency waveform to produce a first beat signal. Second interferometer is arranged to beat unmodulated step frequency waveform and modulated step frequency waveform to produce a second beat signal. These too beat signals, allow a signal processor to cross-correlate the first beat signal and the second beat signal in a frequency domain for each constant frequency of the unmodulated step frequency waveform to produce correlation signals, such that there is one correlation signal for each constant frequency. Those correlation signals are combined in the frequency domain in an order of their respective wavelengths to produce a frequency image of the target in the frequency domain that includes information from different inferred spectra. Next, the signal processor can transform the frequency image using a spatial Fourier transform to produce an image of the target.

Some embodiments are based on recognition that abovementioned principles can be used in making a coherent optical sensor. The advantages of coherent optical detection are tremendous. The information carrying capacity of the optical beam reflected from the target is orders of magnitude greater than other available systems. Simply put, the use of optical heterodyne detection allows for optical radiation detection at the quantum noise level. As such, coherent optical systems provide greater range, accuracy, and reliability than many other measurement systems. Coherent optical systems can also provide a greater scanning range, a greater working depth of field, and may also operate in ambient light conditions. Furthermore, in a coherent system the target beam is not required to dwell upon the target for very long in order to obtain sufficient information about the characteristics of that target location.

To that end, some embodiments disclose an optical sensor using an optical source to generate step frequency waveform. Example of such a source is a laser such as a stepped-frequency laser or a set of single-frequency lasers emitting at different frequencies combined with a timer configured to turn ON and OFF each laser at a corresponding period of time.

Some embodiments are based on another realization that due to complexity of signal processing caused by modulation of step frequency waveform, it is advantageous to reconstruct the target image in a digital domain, rather than, e.g., an optical domain of transmitted and reflected signals. To that end, some embodiments include a photo-detector optically connected to the mixer to produce a digital signal indicative of parameters of an interference of the unmodulated step frequency waveform and the reflection of the modulated step frequency waveform. In those embodiments, the signal processor is digital signal processor configured to reconstruct the target image from the digital signal.

Accordingly, one embodiment discloses a system for a target image reconstruction, including: a stepped frequency transmitter configured to emit a stepped frequency waveform having different constant frequencies at different periods of time; a modulator configured to modulate the stepped frequency waveform emitted at each period of time with a modulation signal to output a modulated stepped frequency waveform with an increased bandwidth; a transceiver configured to transmit the modulated stepped frequency waveform to a target and to accept reflection of the modulated stepped frequency waveform reflected from the target; a mixer to interfere the unmodulated stepped frequency waveform and the reflection of the modulated stepped frequency waveform to produce a beat signal of the interference of the unmodulated stepped frequency waveform with the reflection of the modulated stepped frequency waveform; and a signal processor to reconstruct an image of the target from the beat signal.

Another embodiment discloses a method for a target image reconstruction, including emitting a stepped frequency waveform having different constant frequencies at different periods of time; modulating the stepped frequency waveform emitted at each period of time with a modulation signal to output a modulated stepped frequency waveform with an increased bandwidth; transmitting the modulated stepped frequency waveform to a target and accepting reflection of the modulated stepped frequency waveform reflected from the target; interfering the unmodulated stepped frequency waveform and the reflection of the modulated stepped frequency waveform to produce a beat signal of the interference of the unmodulated stepped frequency waveform with the reflection of the modulated stepped frequency waveform; and reconstructing an image of the target from the beat signal.

BRIEF DESCRIPTION OF THE DRAWINGS

FIG. 1A shows an image reconstruction system according to some embodiments.

DETAILED DESCRIPTION

FIG. 1A shows an image reconstruction system 100 according to some embodiments. The system 100 is configured to reconstruct an image of a scene from a frequency modulated signal reflected from target(s) in the scene. Such an image is referred herein as a target image. The system 100 uses a functionality of linearly swept sources that emit linearly swept waveforms in a frequency domain without cost of manufacturing the ideal linearly swept sources and/or imperfection caused by non-linearity in practical implementation of current linearly swept sources. The system 100 can increase bandwidth of such swept sources without unproportionally high increase of cost of manufacturing typically associated with high bandwidth swept sources.

To that end, the system 100 includes a stepped frequency source configured to emit frequency swept source. The stepped frequency source can cover virtually arbitrarily high bandwidth either without any cost increase associated with increase of the bandwidth or with moderate cost increase. Examples of the stepped frequency source include a step-frequency transmitter such as a step-frequency laser, and a set of single-frequency transmitters when each transmitter emits at different fixed frequency.

Figure 1B:
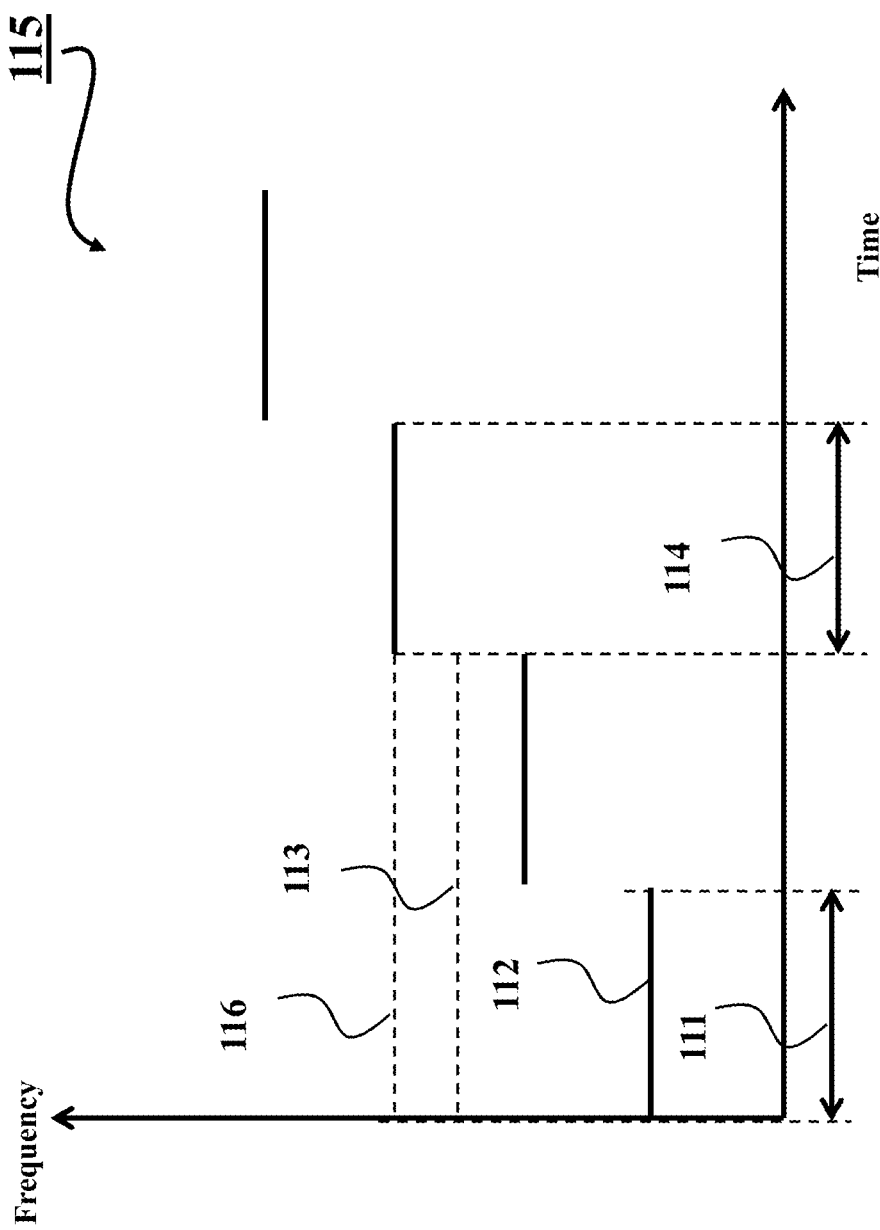
FIG. 1B shows a schematic of stepped frequency waveform used by some embodiments for image reconstruction.

FIG. 1B shows a schematic of stepped frequency waveform 115 used by some embodiments for image reconstruction. The stepped frequency waveform has different constant frequencies at different periods of time, but only a single frequency for each period of time. In this example, step frequency waveform is emitted over a set of equidistant constant frequencies. For example, at a time period 111, the stepped frequency waveform has a constant frequency 112, while at a time period 114, the stepped frequency waveform has a constant frequency 116. In essence, a stepped frequency waveform can be represented by a stepped function, which is a piecewise constant function having only finitely many pieces. Because of these properties, only a small number of frequencies in the covered bandwidth are defined (have values), which degrade the image reconstruction. For example, at the frequency 113, the stepped frequency waveform has no values.

Such a deficiency of the stepped frequency waveform makes it unsuitable for frequency modulated image reconstruction. To address this deficiency, the system 100 includes a modulator 120 configured to modulate the stepped frequency waveform emitted at each period of time with a modulation signal, for example, a pseudo-random pulse train, to output a modulated stepped frequency waveform 125 with an increased bandwidth.

Figure 1C:
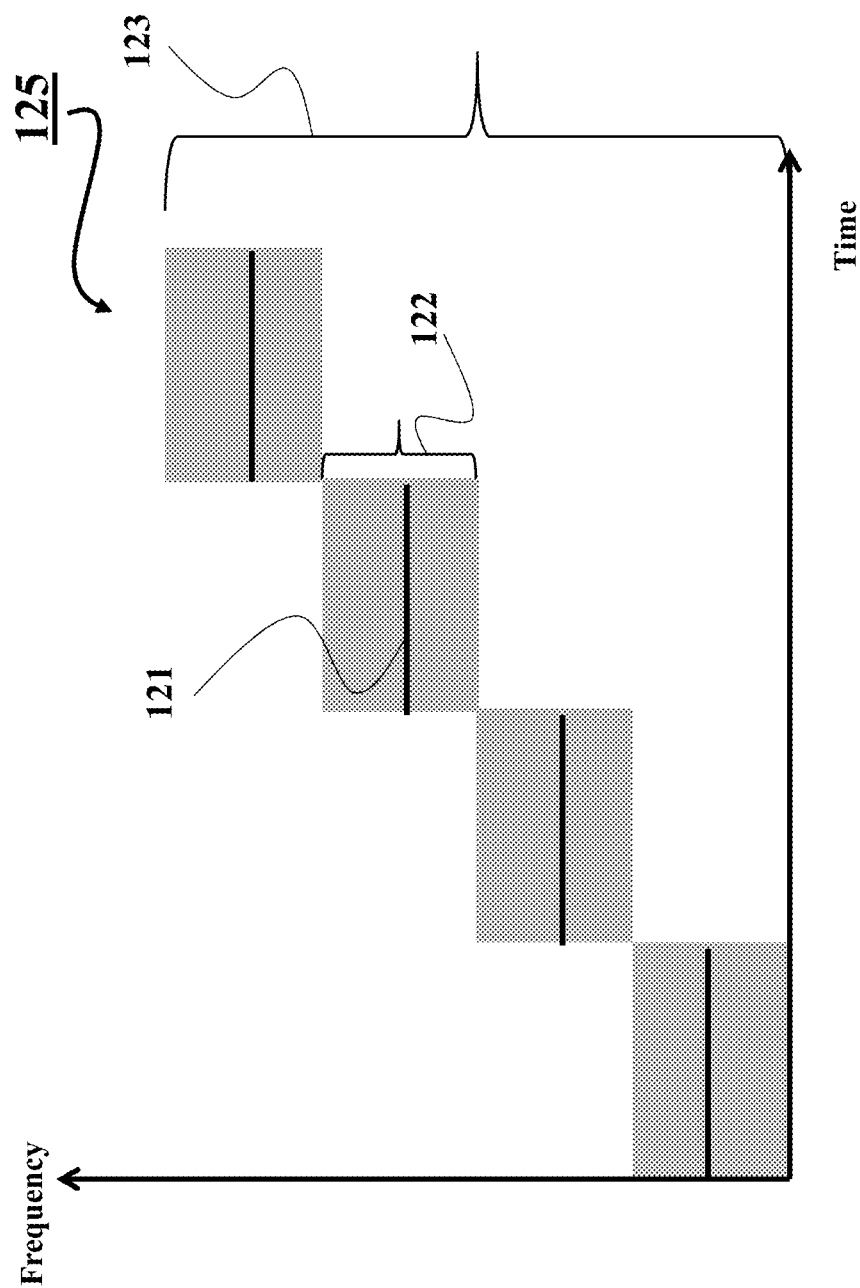
FIG. 1C shows a schematic of a modulated stepped frequency waveform used by some embodiments for image reconstruction.

FIG. 1C shows a schematic of a modulated stepped frequency waveform 125 used by some embodiments for image reconstruction. Some embodiments are based on realization that each constant frequency of a stepped frequency waveform can be modulated to increase its bandwidth. In effect, such modulation spreads the constant frequency to completely occupy a range of the bandwidth that includes that constant frequency. For example, a frequency 121 is modulated, i.e., spread, over the frequency range 122. Each constant frequency after modulation can be represented by a range function that returns each value of the frequency within a range 122. The modulation function is selected such that the modulated stepped frequency waveform occupies the entire bandwidth 123 including the lowest and the highest constant frequencies of the stepped frequency waveform.

In general, a modulator 120 is a device configured to modulate an incoming signal. For example, some embodiments use an electro-optic modulator (EOM) which is an optical device in which a signal-controlled element exhibiting the electro-optic effect is used to modulate a beam of light. In one embodiment, the modulation is imposed on the phase and/or frequency of the beam. Modulation bandwidths extending into the gigahertz range are possible with the use of laser-controlled modulators.

The electro-optic effect is the change in the refractive index of a material resulting from the application of a DC or low-frequency electric field. This is caused by forces that distort the position, orientation, or shape of the molecules constituting the material. Generally, a nonlinear optical material (organic polymers have the fastest response rates, and thus are best for this application) with an incident static or low frequency optical field will see a modulation of its refractive index. In one implementation, the EOM includes a crystal, such as lithium niobate, whose refractive index is a function of the strength of the local electric field. That means that if lithium niobate is exposed to an electric field, light will travel more slowly through it. The phase of the light leaving the crystal is directly proportional to the length of time it takes that light to pass through it. Therefore, the phase of the laser light exiting an EOM can be controlled by changing the electric field in the crystal.

In one embodiment, the stepped frequency waveform has a constant height for each step, such that the difference between any two neighboring frequencies is constant. In this embodiment, a single modulator configured to spread a constant frequency over a range defined by the step of the stepped frequency waveform can modulate the entire stepped frequency waveform to occupy the entire bandwidth. In such a manner, a single stepped frequency swept source (which can be implemented with multiple constant frequency sources) and a single modulator can produce a modulated signal that covers virtually arbitrarily large bandwidth 123.

In such a manner, a combination of stepped frequency transmitter and a modulator can increase bandwidth of the transmitted signal without an unproportionally high increase of the cost of the transmitter. However, in order to use the modulated stepped frequency waveform in image reconstruction, there is a need to change the principles of image reconstruction from reflection of transmission of frequency modulated signals. Typically, the ideal swept source calls for target image reconstruction from the interference of the transmitted and reflected signals. The reason for that is when the ideal linear swept source is used, at each instance of time there is a one-to-one correspondence between this interfered signal and Fourier transform of the target image allowing for the target image reconstruction. However, in contrast with the ideal linear swept source, the modulated stepped frequency waveform 125 transmitted to the target does not have this one-to-one mapping as the frequency values of the modulated signal spectrum are not linearly increasing in time. To that end, the recovery of the target image from an interference of the signal modulated from the stepped frequency signal and its reflection from the target can be an ill-posed or underdetermined problem.

Some embodiments are based on realization that the target image can be reconstructed from the reflection of transmitted modulated stepped frequency waveform based on interference of the reflection of the modulated stepped frequency waveform with a single value waveform that has only a single value of frequency at each point of time. Notably, in such a manner, the target image is reconstructed not from the interference of the transmitted and received waveforms, but from the interference of received waveform with some other different (not transmitted) waveform. However, an interference of an arbitrarily single value waveform with the reflection of the modulated stepped frequency waveform can pose high bandwidth requirements on an mixer interfering these waveforms due to potential large difference in bandwidths between the modulated stepped frequency waveform and a single value waveform. This high bandwidth requirement of an mixer can undesirably increase the cost of the sensor.

Some embodiments are based on realization that an unmodulated stepped frequency waveform is a single value waveform that mimics the frequency change of the reflected stepped frequency waveform. Thus, an interference of the unmodulated stepped frequency waveform and the reflection of the modulated stepped frequency waveform can be performed with a single mixer having a bandwidth comparable with the frequency step of the stepped frequency waveform.

To that end, the system 100 includes a transceiver 130 configured to transmit the modulated stepped frequency waveform 125 to a target and to accept reflection 135 of the modulated stepped frequency waveform reflected from the target and a mixer 140 configured to interfere the unmodulated stepped frequency waveform 115 and the reflection 135 of the modulated stepped frequency waveform to produce a beat signal 145 of the interference of the unmodulated stepped frequency waveform with the reflection of the modulated stepped frequency waveform.

In addition, the system 100 includes a signal processor 150 to reconstruct an image 155 of the target from the beat signal 145. Hence, some embodiments reconstruct the target image not from the interference of transmitted and received signals, but from the interference of unmodulated (but not transmitted signal) and the reflected signal. Specifically, some embodiments detect an interference of unmodulated (but not transmitted) stepped frequency waveform and the reflection from transmission of modulated stepped frequency waveform and deconvolve the received modulation signal from the received interference to form an inferred target spectrum, and reconstruct the target image from the target spectrum.

Figure 1D:
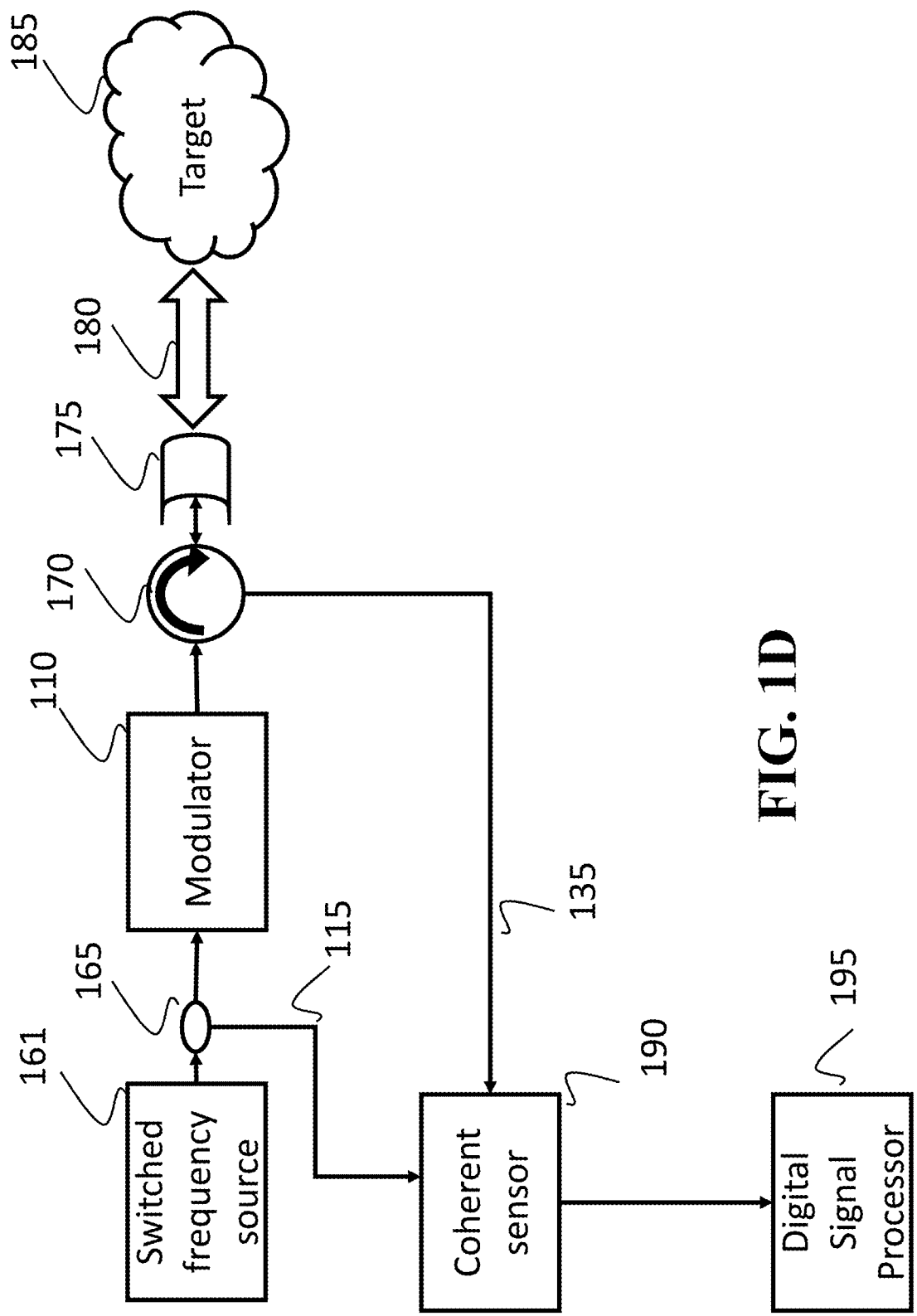
FIG. 1D shows a stepped frequency coherent sensing system according to some embodiments.

FIG. 1D shows a stepped frequency coherent sensing system according to some embodiments. A waveform emitted by a stepped frequency source 161, is split 165 into two waveforms. One waveform is modulated with a modulator 110, before being sent to a circulator 170. A circulator is a passive non-reciprocal three- or four-port device, in which a microwave or radio frequency signal entering any port is transmitted to the next port in rotation. In one implementation, circulator 170 is a 3-port circulator designed such that a signal entering any port exits from the next. This means that if signal enters port 1 it is emitted from port 2, but if some of the emitted signal is reflected back to the circulator, it does not come out of port 1 but instead exits from port 3.

In embodiments using optical signals, e.g., using lasers as a stepped frequency source, the circulator 170 is an optical circulator.

The modulated waveform emitted from the second port of the circulator 170 is sent to an imaging head 175. Imaging head is a device that provides for the coupling of light into and out of the sensor, and directing the light onto a target. The modulated waveform is then sent over the free-space channel 180 to the target 185. The reflection from the target is then gathered by the imaging head 175, before being transmitted between ports 2 and 3 of the circulator 170. The reflected signal 135 is then mixed with the unmodulated stepped-frequency waveform 115 in a mixer 190, before being processed by the signal processor 150 such as a digital signal processor 195.

In some embodiments, the waveform emitted by the stepped frequency source is a coherent waveform and the system of FIG. 1D is a "coherent" optical transmission system having capability to do "coherent detection," which means that an optical receiver can track the phase of an optical transmitter (and hence "phase coherence") so as to extract any phase and frequency information carried by a transmitted signal.

For example, in some embodiments, the mixer 190 is a coherent sensor transforming the received signals into a digital domain and the signal processor 150 is also implemented 195 in the digital domain. In these embodiments, the mixing and image recovering functionality are performed with the sensor 190 and digital signal processor 195 in the digital domain.

Some embodiments are based on another realization that each step frequency of the modulated stepped frequency waveform can be processed separately. This is advantageous because the bandwidth may be extended arbitrarily by using an arbitrarily large number of lasers An individual target image reconstruction for each step frequency produces a low resolution of a target image corresponding to a small bandwidth of modulation of corresponding step frequency. However, these low resolution target images for different step frequencies can be combined together in a frequency domain to increase a resolution of the target image. To that end, some embodiments measure multiple of inferred target spectra, with different frequencies of unmodulated stepped frequency waveform and construct an inferred spectrum including the information from all of the inferred target spectra. By joining these spectra together in the frequency domain, some embodiments construct a ptychographic super-resolution image of the target.

Figure 2A:
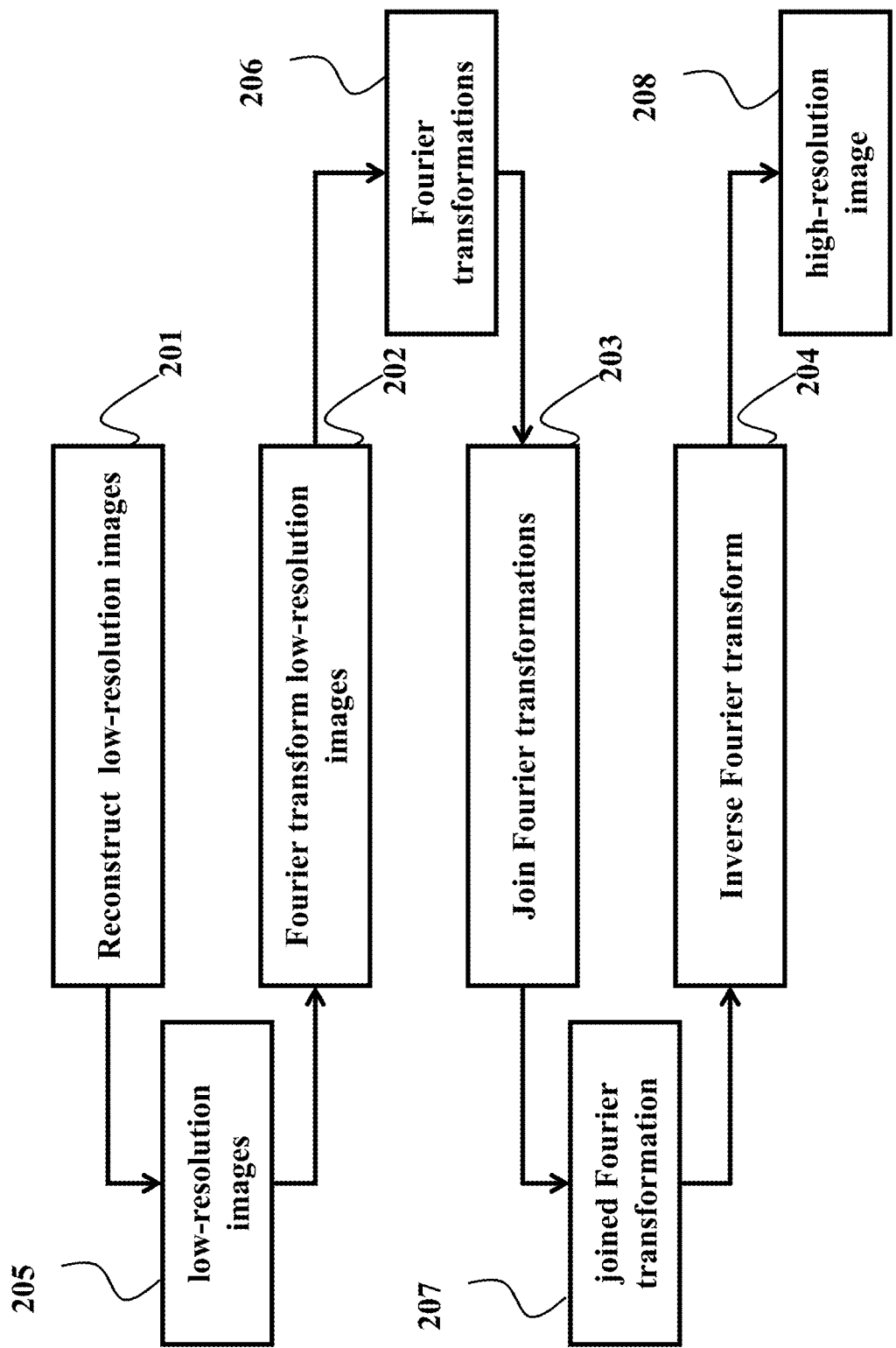
FIG. 2A shows a flow chart of a method for a super-resolution target image reconstruction according to one embodiment.

FIG. 2A shows a flow chart of a method for a super-resolution target image reconstruction according to one embodiment. In this embodiment, the signal processor is configured to reconstruct 201 a low-resolution image for each step frequency of the unmodulated step frequency waveform to produce a set of low-resolution images 205 and transform 202 the set of low-resolution images with a Fourier transform to produce a set of Fourier transformations 206. The signal processor joins 203 the set of Fourier transformations with respect to their corresponding step frequencies to produce a joined Fourier transformation 207, and inverse Fourier transform 204 of the joined Fourier transformation to produce the target image 208 with resolution higher than resolution of the low-resolution images 205. Concatenating the spectra of low resolution images therefore allows to generate the high resolution image. A high resolution image is impossible to generate without the entire bandwidth of the concatenated spectrum.

For example, to reconstruct 201 the low resolution images 205, some implementation solve $$y_i = x_{Ti} * x_{Ri}$$

Where $y_i$ is the i-th image y; $x_{Ti}$ is the i-th reflection from the target; $x_{Ri}$ is the i-th reference signal. The operator * denotes convolution.

The Fourier transformation 202 of the low-resolution images 205 can be performed according to the fast-Fourier transform (FFT). The set of Fourier transformations 206 can be joined together 203 according to the absolute frequencies represented by their respective values. Next, the joined Fourier transformation 207 is inverted 204 according to the inverse fast-Fourier transform (IFFT) to produce the high-resolution image 208.

Figure 2B:
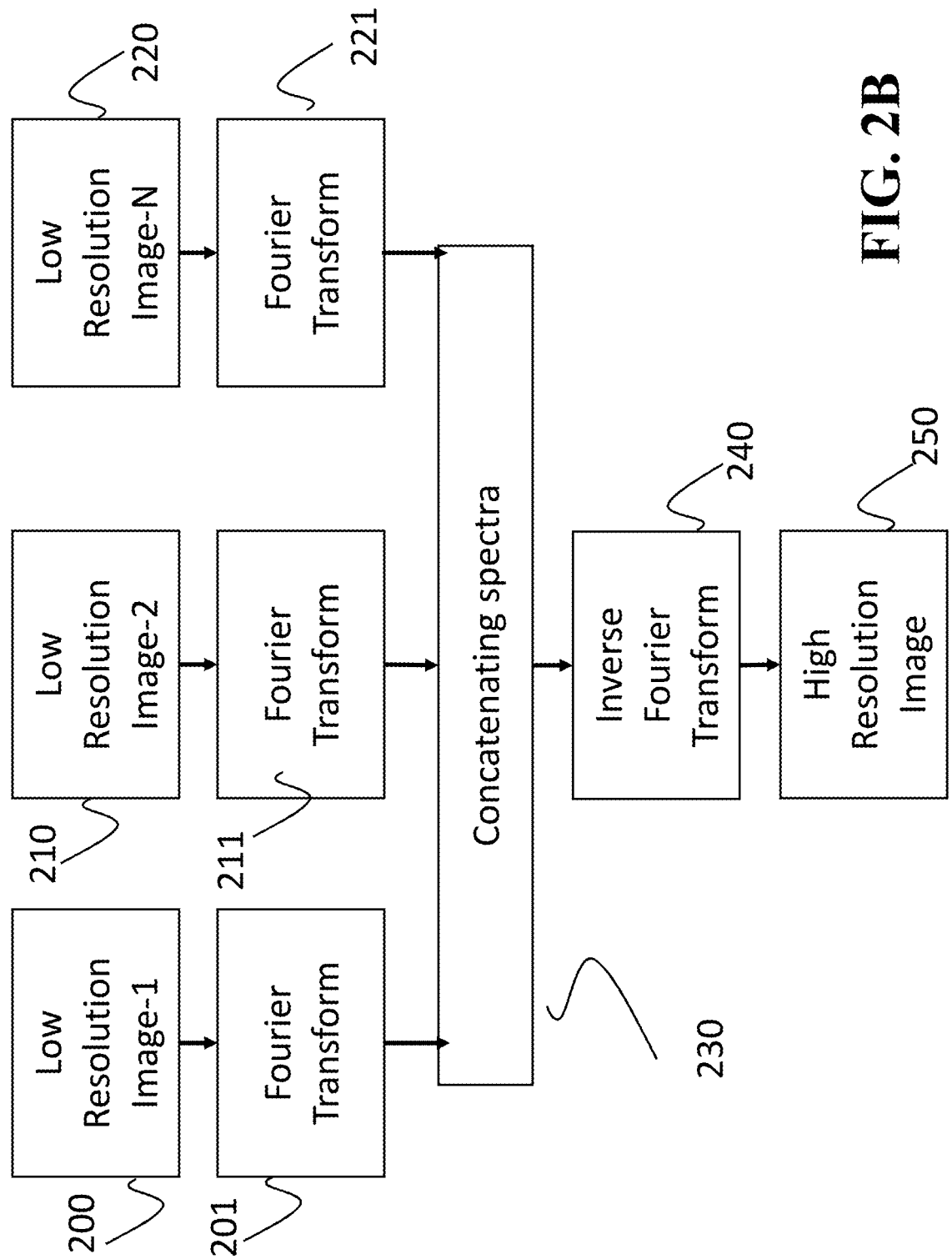
FIG. 2B shows a signal flow model for the super-resolution target image reconstruction of FIG. 2A according to one embodiment.

FIG. 2B shows a signal flow model for the super-resolution target image reconstruction of FIG. 2A according to one embodiment. A set of at least two low resolution images 200, 210, 220, are transformed into the Fourier domain by a set of FFTs 201, 211, 221. The resulting spectra are then concatenated 230, before being transformed back into the image domain by an IFFT 240, to produce a high resolution image 250.

Figure 2C:
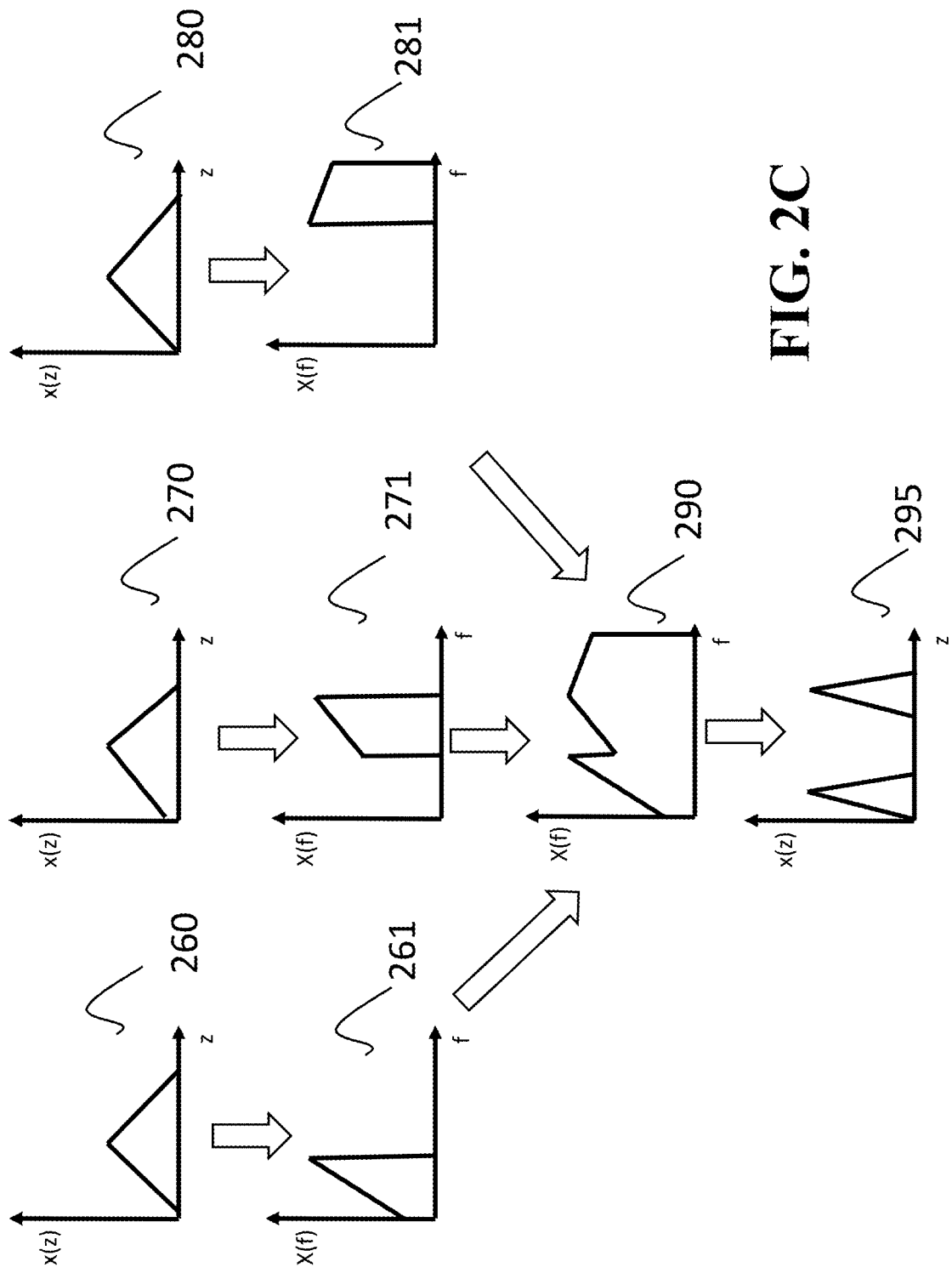
FIG. 2C shows an example of signals and spectra of the super-resolution target image reconstruction of FIG. 2A.

FIG. 2C shows example of signals and spectra of the super-resolution target image reconstruction of FIG. 2A. A set of low resolution images 260, 270, 280, are transformed into the Fourier domain to produce a set of low-bandwidth, non-overlapping spectra 261, 271, 281. The resulting spectra are then concatenated to produce a single high bandwidth spectrum 290, before being transformed back into the image domain by an IFFT to produce a high resolution image 295.

Some embodiments are based on another realization that the knowledge of parameters of modulation can be useful for target image reconstruction. Examples of parameters of modulation include the modulation signal, the system impulse response, and a modulation sequence timing denoting the relative phase of the modulation sequence relative to the measurement apparatus. Specifically, a waveform reflected from a target is affected by a number of processes including a processes of interest and ancillary processes. The process of interest is a reflection from the target image. This process affects the waveform in a manner allowing reconstructing the target image. The ancillary processes include a manner of generation of the waveform and modulation of the waveform. The effect of generation is reduced by interfering the reflection of the modulated step frequency waveform and the original and unmodulated step frequency waveform. However, there is also a need to consider the effects of modulation during the target image reconstruction.

Parameters of modulations have different principles than the principles of propagation of processed waveforms. Hence, it can be difficult to consider those parameters directly in the target image reconstruction. However, some embodiments are based on realization that one way to consider the modulation in target image reconstruction is by having a reference signal indicative of interference of unmodulated and modulated step frequency waveforms allowing to receive the parameters of modulation in a form similar to the form of the process waveforms. This reference signal can help to separate effects of modulation on the reflection of the modulated stepped frequency waveform.

Figure 3:
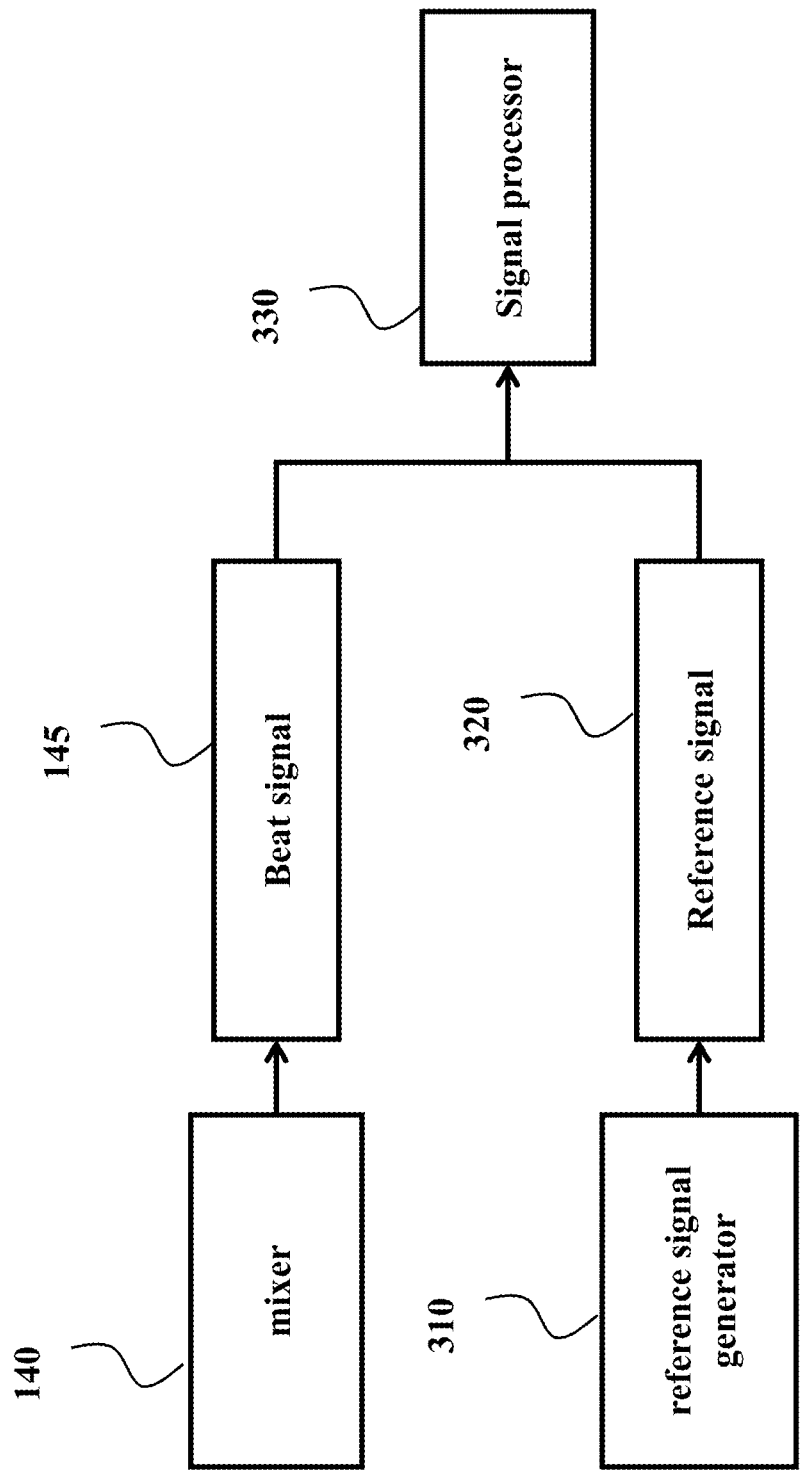
FIG. 3 shows a schematic of reference system used by some embodiments.

FIG. 3 shows a schematic of reference system used by some embodiments. In these embodiments, the system 100 includes a reference signal generator 310 configured to generate a reference signal 320 indicative of interference of the unmodulated step frequency waveform and the modulated step frequency waveform. Hence, the signal processor 330 reconstructs the target image using the beat signal 145 and the reference signal 320.

Figure 4A:
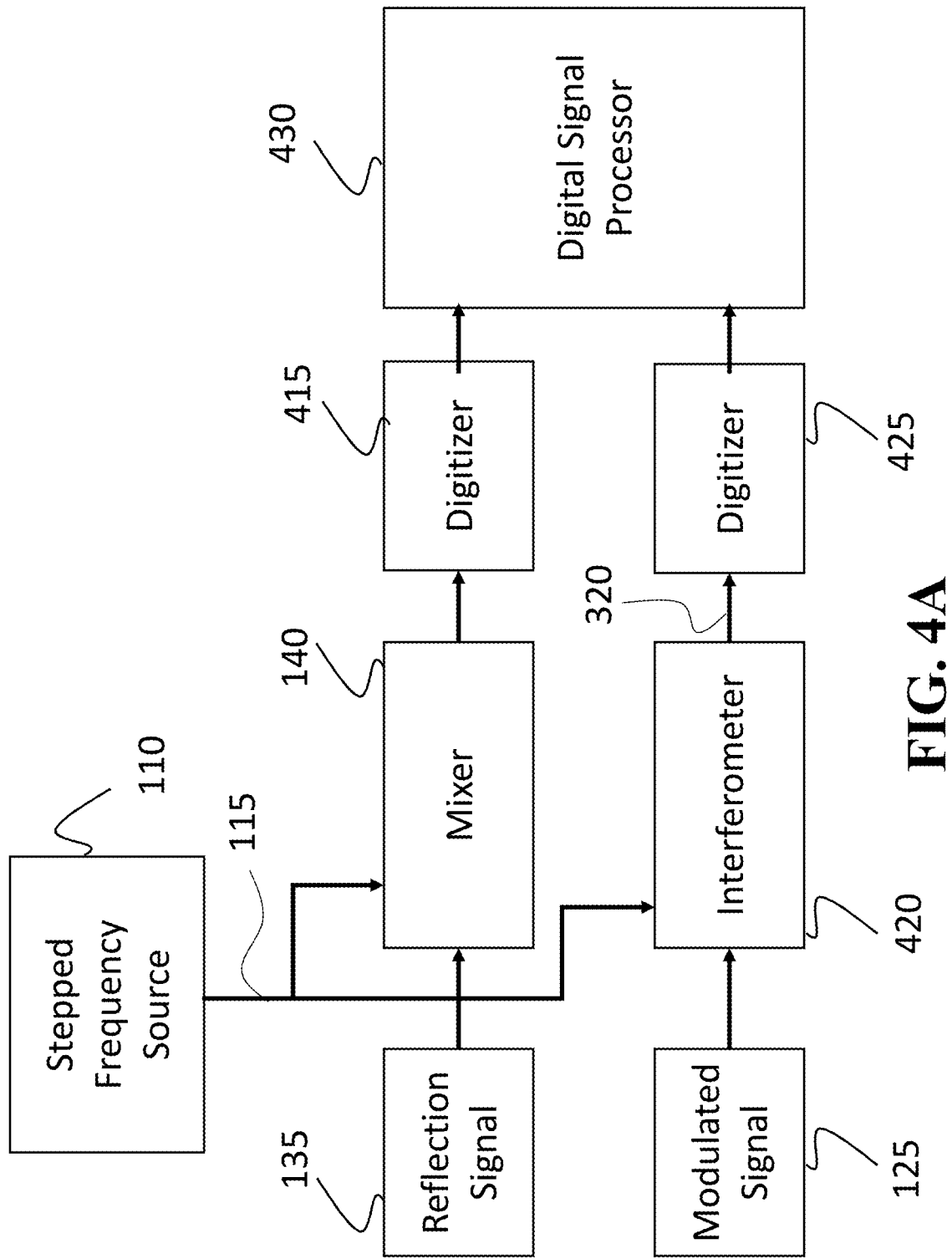
FIG. 4A shows a schematic of one embodiment reconstructing a target image using a reference signal.

FIG. 4A shows a schematic of one embodiment reconstructing a target image using a reference signal. In this embodiment, the signal processor is a digital signal processor 420 and the beat signal 145 generated by the mixer 140 is converted in a digital domain using a digitizer 415. In this embodiment, the reference signal generator includes an interferometer 420 arranged to beat the unmodulated step frequency waveform 115 and the modulated step frequency waveform 125 to produce the reference signal 320. The system 100 also includes a digitizer 425 configured to convert the reference signal 320 in the digital domain.

Figure 4B:
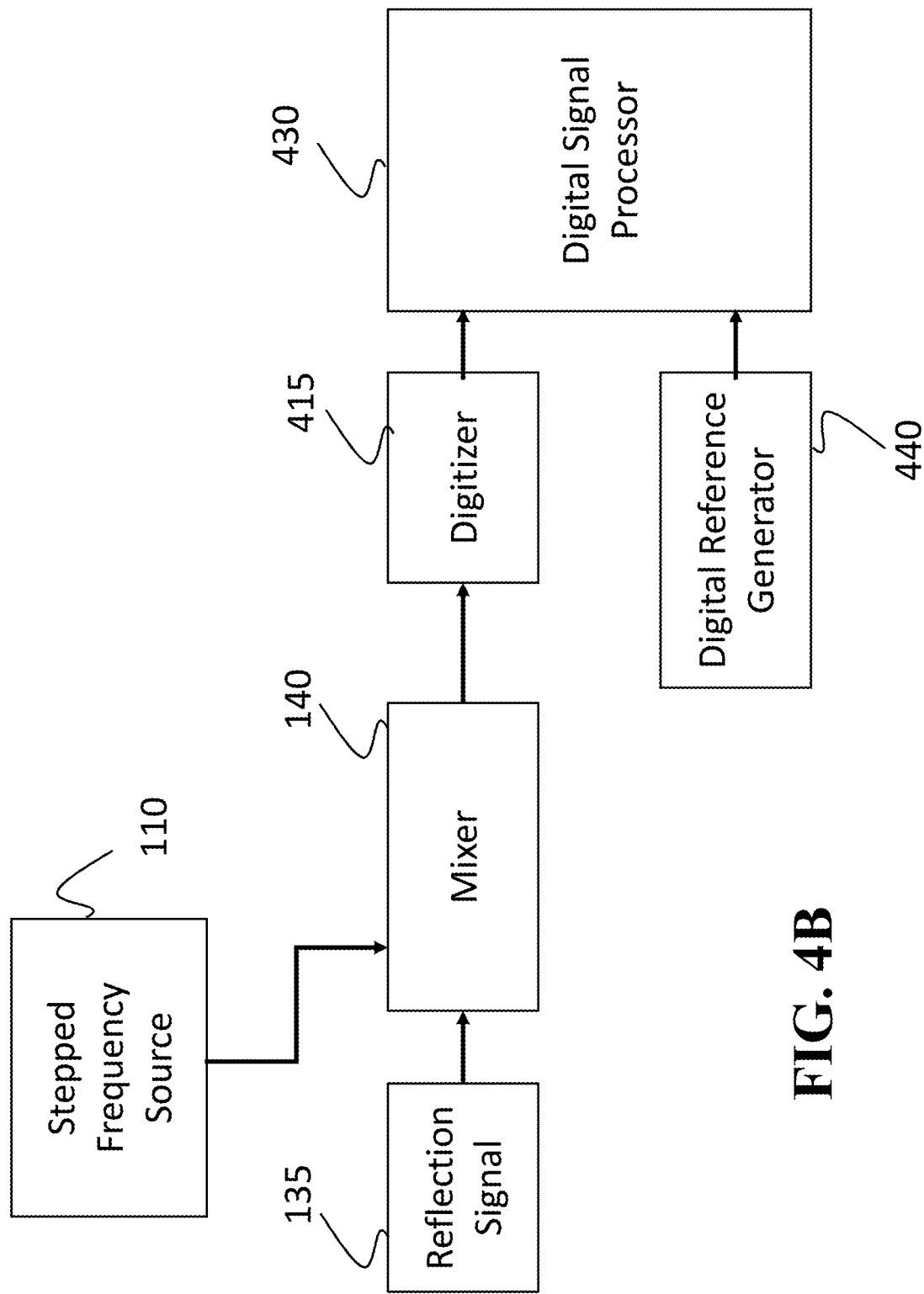
FIG. 4B shows a schematic of another embodiment for reconstructing a target image using a reference signal.

FIG. 4B shows a schematic of another embodiment for reconstructing a target image using a reference signal. In this embodiment, the reference signal 320 is directly generated in digital domain. In this embodiment, the reference signal generator is a digital generator 440 constructing the reference signal in a digital domain. For example, the reference signal can be generated using the modulation signal, the system impulse response, and a modulation sequence timing. The reference signal may be generated by, for example, convolving the modulation signal with the system impulse response, and then delaying it by the correct time delay according to the modulation sequence timing.

In some embodiments using reference signal, to reconstruct the target image, the signal processor cross-correlate the beat signal and the reference signal in a frequency domain for each constant frequency of the unmodulated step frequency waveform to produce correlation signals, such that there is one correlation signal for each constant frequency. Those correlation signals are combined in the frequency domain in an order of their respective wavelengths to produce a frequency image of the target in the frequency domain that includes information from different inferred spectra. Next, the signal processor transforms the frequency image using an inverse Fourier transform to produce an image of the target. This image has a higher resolution than the component images, which have lower bandwidth and therefore lower resolution.

Figure 5:
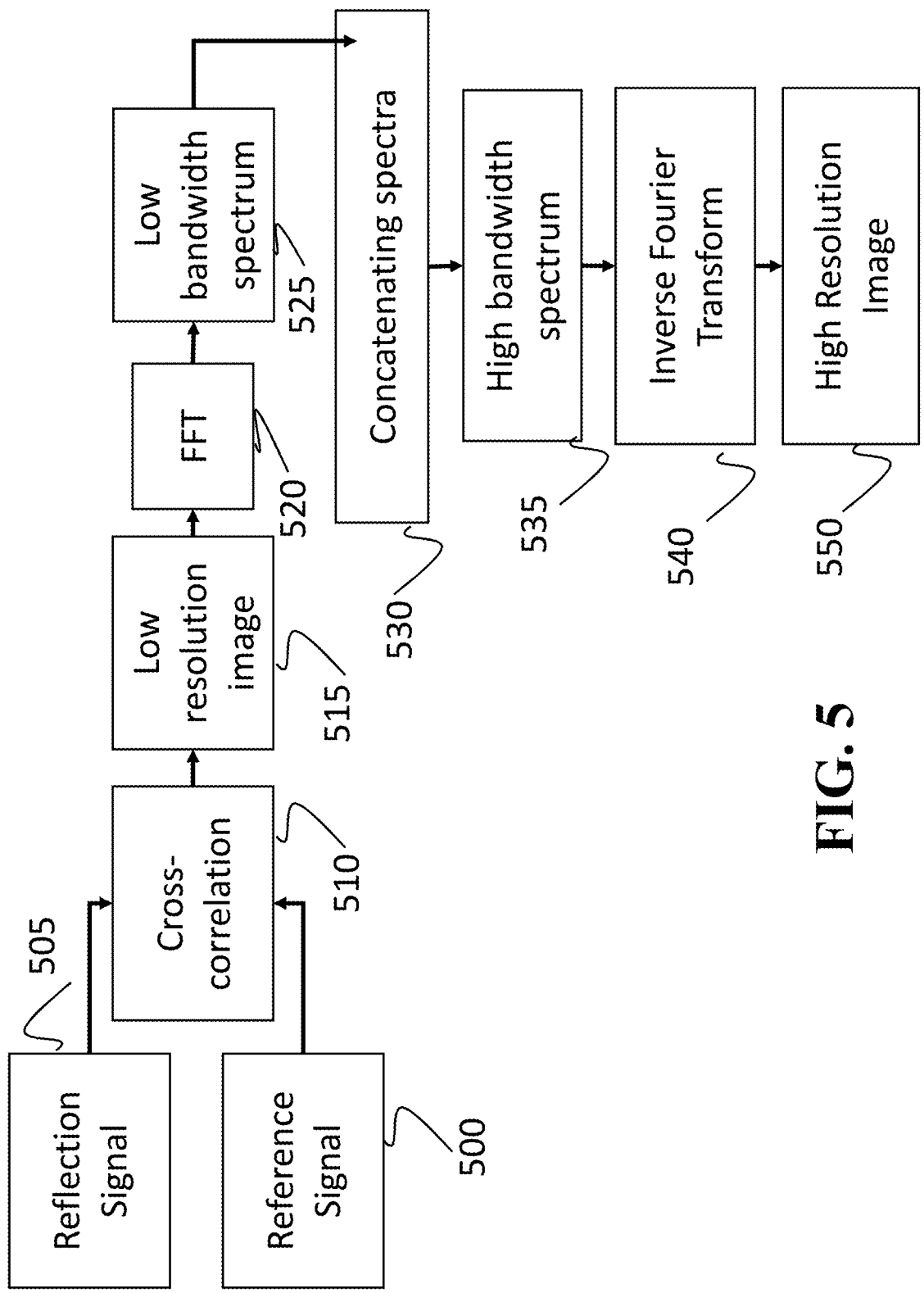
FIG. 5 shows signal flow schematic for the cross-correlation based image computation including spectral concatenation according to one embodiment.

FIG. 5 shows the DSP signal flow schematic for the cross-correlation based image computation including spectral concatenation according to one embodiment. A reflection signal 505 and a reference signal 500 are cross correlated 510 to calculate a low-resolution image 515. This low resolution image is then transformed to the Fourier domain by an FFT 520 to produce a low-bandwidth spectrum 525. This spectrum is then concatenated in frequency domain with other such non-overlapping low bandwidth spectra 530 to produce a high-bandwidth spectrum 535. This is then transformed with an IFFT 540 into the image domain to produce a high resolution image 550.

Some embodiments are based on recognition that above-mentioned principles can be used in making a coherent optical sensor. The advantages of coherent optical detection are tremendous. The information carrying capacity of the optical beam reflected from the target is orders of magnitude greater than other available systems. Simply put, the use of optical heterodyne detection allows for optical radiation detection at the quantum noise level. As such, coherent optical systems provide greater range, accuracy, and reliability than many other measurement systems. Coherent optical systems can also provide a greater scanning range, a greater working depth of field, and may also operate in ambient light conditions. Furthermore, in a coherent system the target beam is not required to dwell upon the target for very long in order to obtain sufficient information about the characteristics of that target location.

Figure 6:
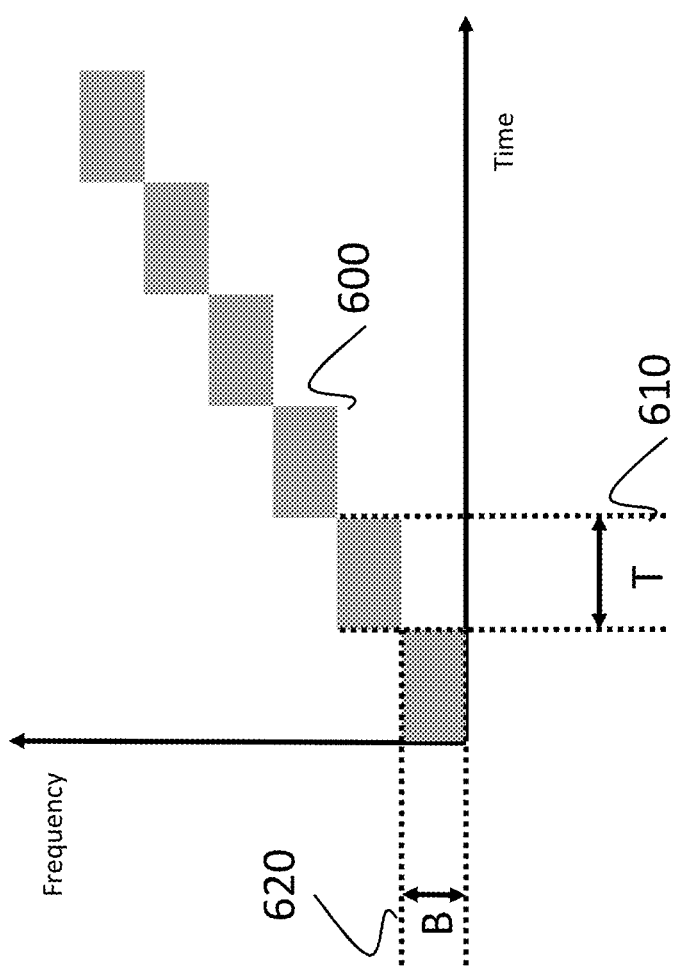
FIG. 6 shows a schematic spectrogram of the stepped frequency optical waveform with modulation used by some embodiments.

FIG. 6 shows a schematic spectrogram of the stepped frequency optical waveform with modulation used by some embodiments. A set of carriers 600 are shown with finite duration T 610 and modulation induced bandwidth B 620. To that end, some embodiments disclose an optical sensor using an optical source to generate step frequency waveform. Example of such a source is a laser such as a stepped-frequency laser or a set of single-frequency lasers emitting at different frequencies combined with a timer configured to turn ON and OFF each laser at a corresponding period of time.

Figure 7A:
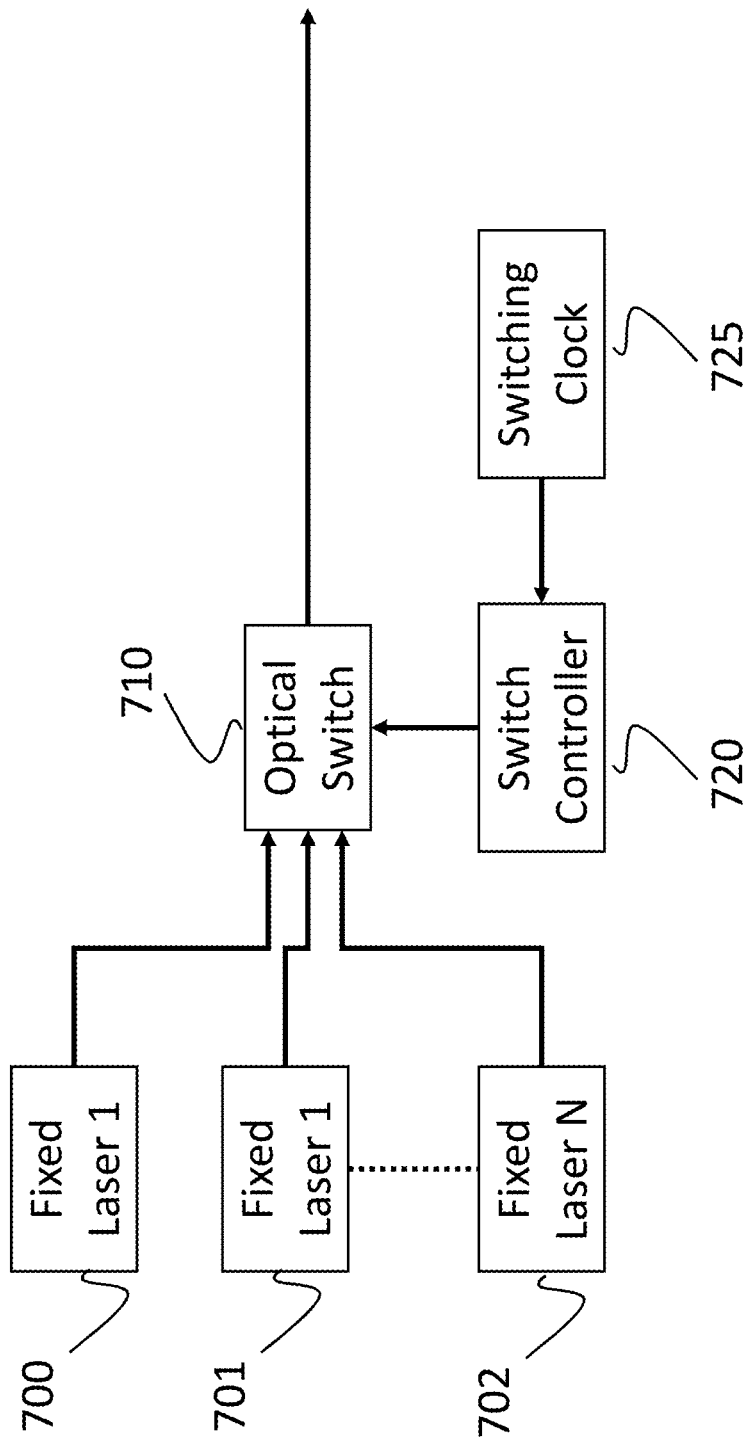
FIG. 7A shows a system diagram of a stepped frequency source according to one embodiment.

FIG. 7A shows a system diagram of a stepped frequency source according to one embodiment. In this embodiment, the stepped frequency source is a stepped frequency laser incorporating many fixed frequency lasers and optical switching. A set of fixed frequency lasers 700, 701, 702 are input into an optical switch 710. The switch is operated with a switch controller 720 to determine the switching sequence, with a switching clock 725 to determine the switching timing.

Figure 7B:
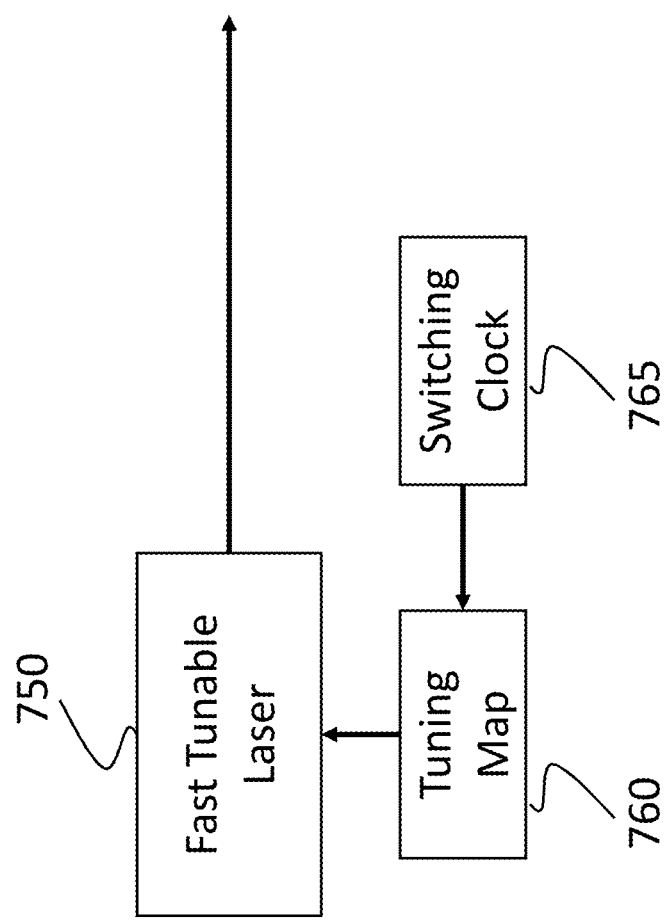
FIG. 7B shows a system diagram of a stepped frequency source according to another embodiment.

FIG. 7B shows a system diagram of a stepped frequency source according to another embodiment. In this embodiment, the stepped frequency source includes a stepped frequency laser incorporating a single fast switching laser with electronic control. A fast switching laser 750 is controlled with an electronic tuning map 760 to determine the switching sequence and a switching clock 765 to determine the switching timing.

Some embodiments are based on another realization that due to complexity of signal processing caused by modulation of step frequency waveform, it is advantageous to reconstruct the target image in a digital domain, rather than, e.g., an optical domain of transmitted and reflected signals. To that end, some embodiments include a photo-detector optically connected to the mixer to produce a digital signal indicative of parameters of an interference of the unmodulated step frequency waveform and the reflection of the modulated step frequency waveform. In those embodiments, the signal processor is digital signal processor configured to reconstruct the target image from the digital signal.

Figure 8:
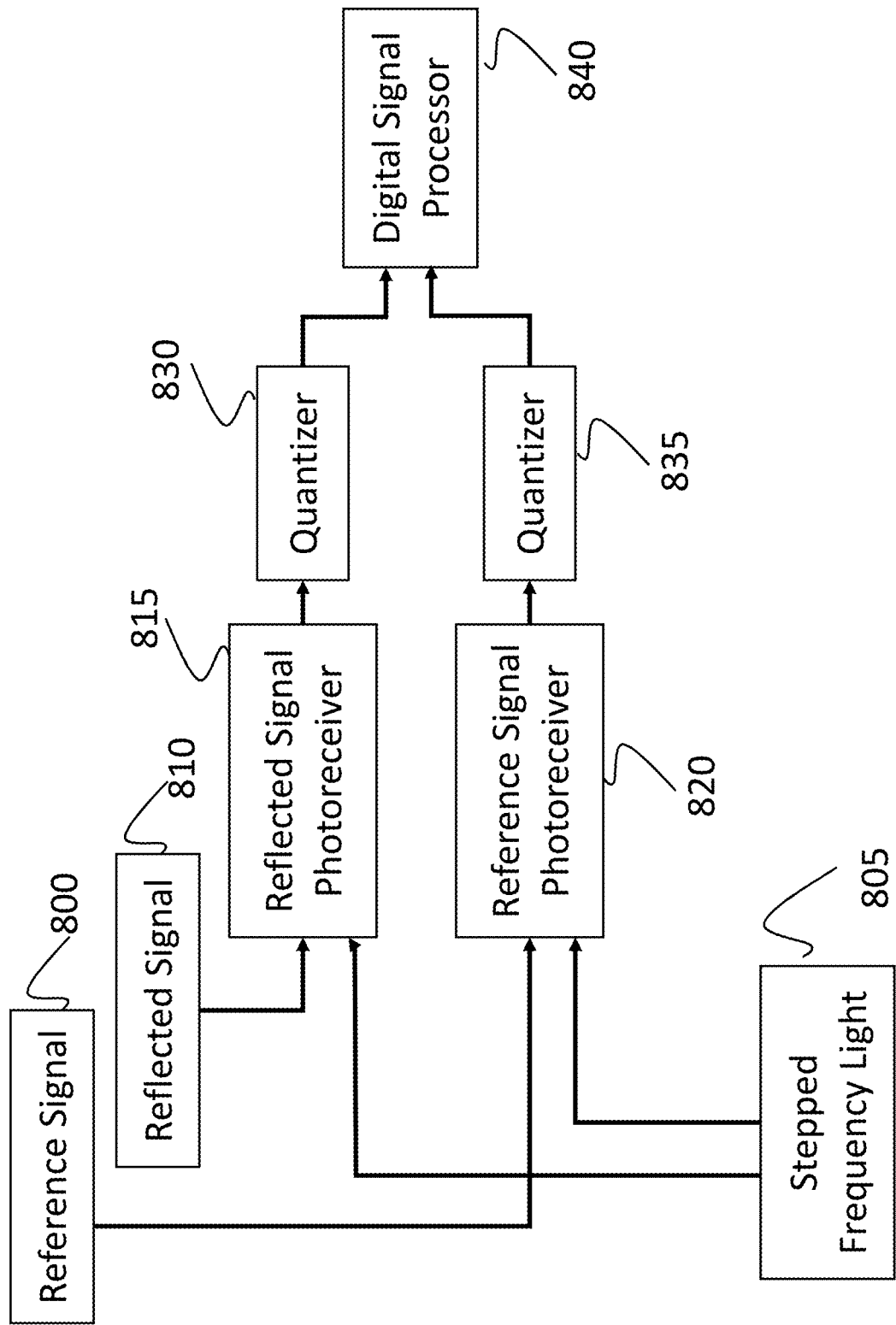
FIG. 8 shows a schematic for an optical sensor/mixer incorporating an optical reference signal according to one embodiment.

FIG. 8 shows a schematic for an optical sensor/mixer incorporating an optical reference signal according to one embodiment. A reference signal 800 and a reflected signal 810 are input into a pair of photoreceivers 815, 820 where they are mixed with light from a stepped frequency optical source 805. The two resulting interference signals are then quantized 830, 835, before being processed in a digital signal processor 840.

Figure 9:
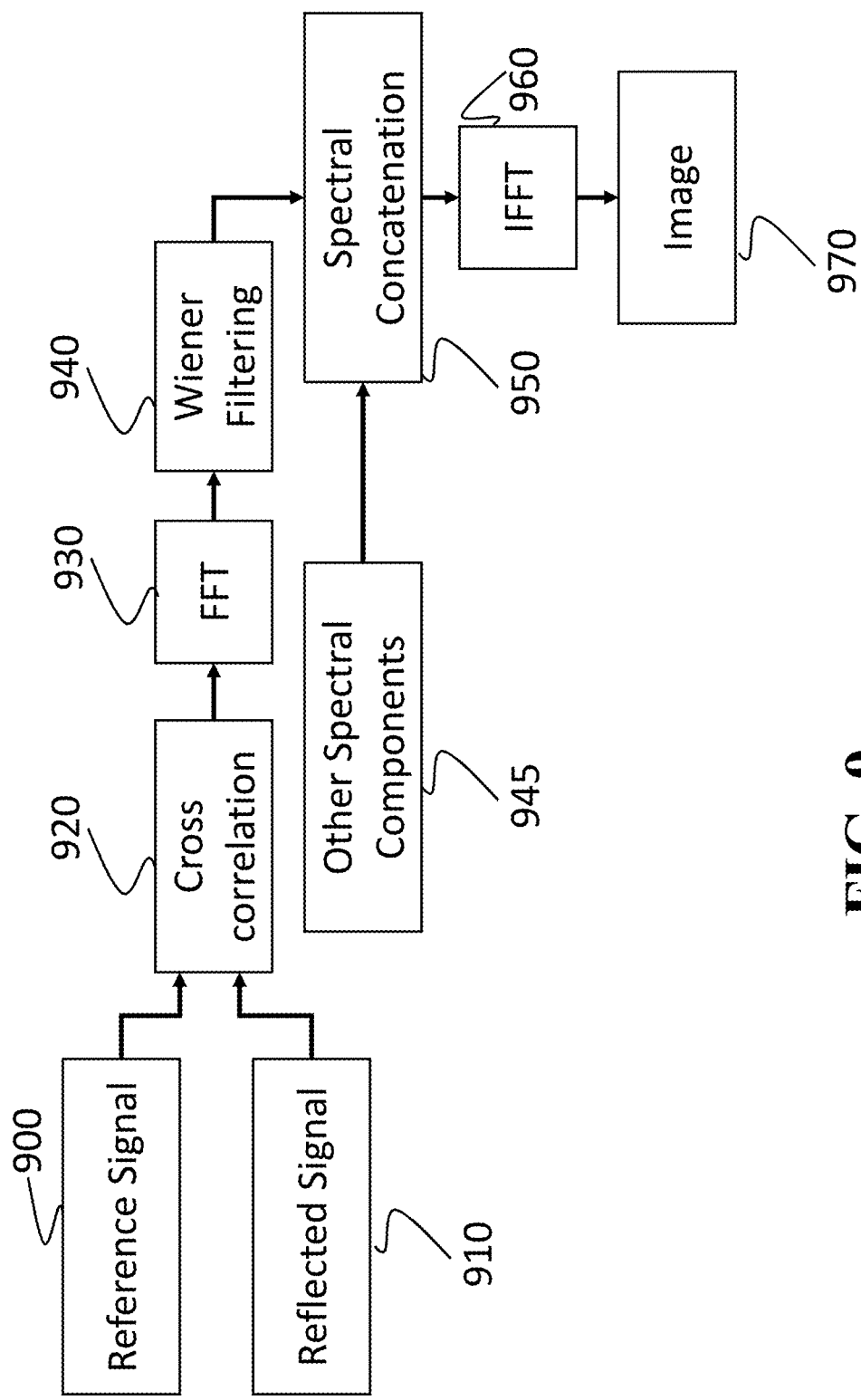
FIG. 9 shows a schematic of an example image reconstruction algorithm in a digital signal processor for an optical sensor according to one embodiment.

FIG. 9 shows a schematic of an example image reconstruction algorithm in a digital signal processor for an optical sensor according to one embodiment. Cross correlation 920 is calculated between a reference signal 900 and a reflected signal 910 to determine a low resolution image. This image is then transformed into the spectral domain by an FFT 930, where it may be enhanced by methods to reduce the impact of low-pass filtering, such as a Wiener filter 940. The component spectrum is then combined 950 with other such spectra 945 to create a high bandwidth spectrum. This spectrum is then transformed back into the image domain by an IFFT 960 to produce a high resolution image 970.

Figure 10:
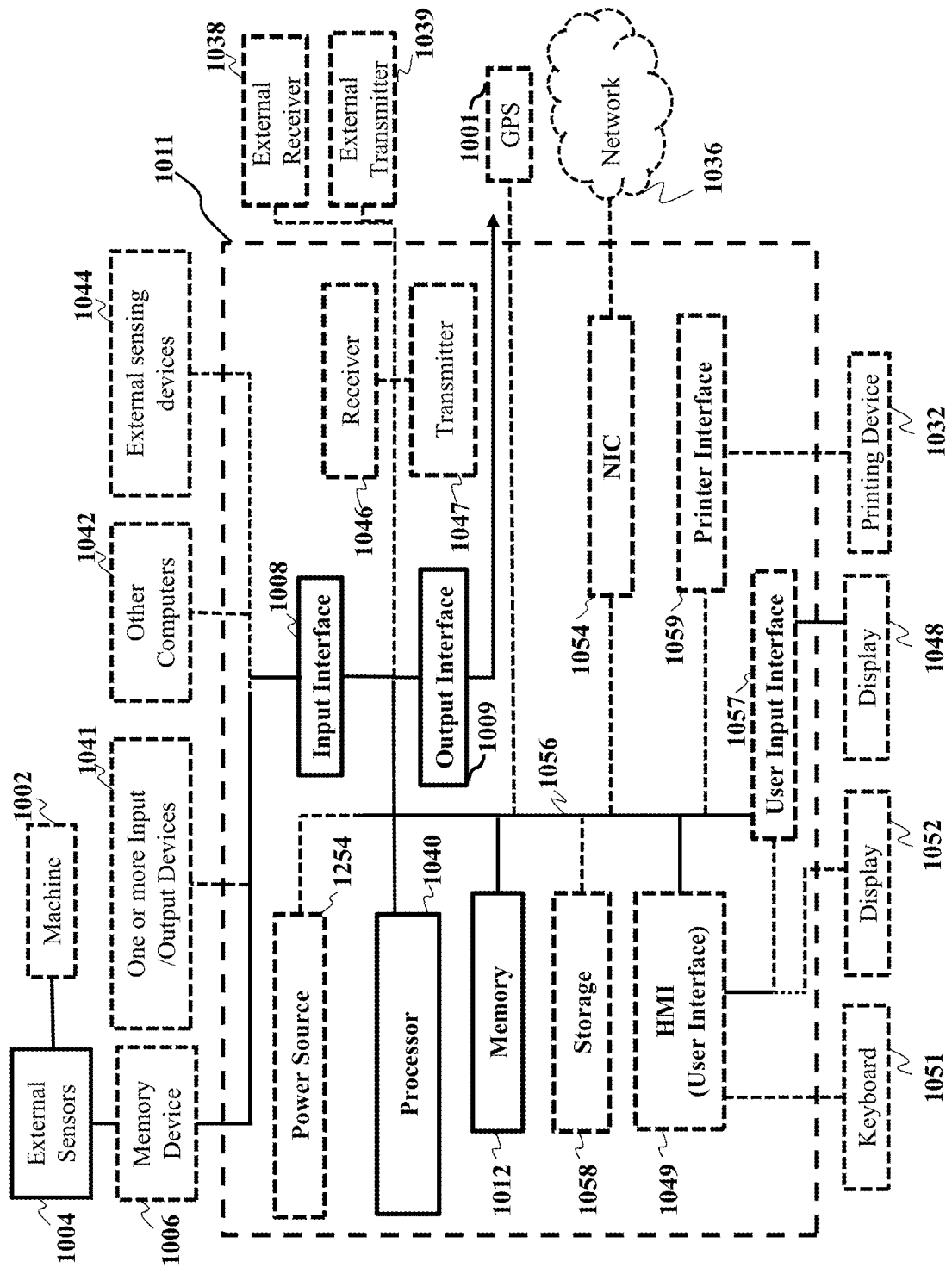
FIG. 10 is a block diagram of exemplar implementations of principles of a system of of FIG. 1A according to some embodiments.

FIG. 10 is a block diagram of exemplar implementations of principles of a system 100 of of FIG. 1A, that can be implemented using an alternate computer or hardware processor, according to some embodiments. The computer 1011 includes a hardware processor 1040, computer readable memory 1012, storage 1058 and user interface 1049 with display 1052 and keyboard 1051, which are connected through bus 1056. For example, the user interface 1064 in communication with the hardware processor 1040 and the computer readable memory 1012, acquires and stores the signal data examples in the computer readable memory 1012 upon receiving an input from a surface, keyboard surface 1064, of the user interface 1064 by a user.

The computer 1011 can include a power source 1054, depending upon the application the power source 1054 may be optionally located outside of the computer 1011. Linked through bus 1056 can be a user input interface 1057 adapted to connect to a display device 1048, wherein the display device 1048 can include a computer monitor, camera, television, projector, or mobile device, among others. A printer interface 1059 can also be connected through bus 1056 and adapted to connect to a printing device 1032, wherein the printing device 1032 can include a liquid inkjet printer, solid ink printer, large-scale commercial printer, thermal printer, UV printer, or dye-sublimation printer, among others. A network interface controller (NIC) 1034 is adapted to connect through the bus 1056 to a network 1036, wherein time series data or other data, among other things, can be rendered on a third-party display device, third-party imaging device, and/or third-party printing device outside of the computer 1011.

Still referring to FIG. 10, the signal data or other data, among other things, can be transmitted over a communication channel of the network 1036, and/or stored within the storage system 1058 for storage and/or further processing. Contemplated is that the signal data could be initially stored in an external memory and later acquired by the hardware processor to be processed or store the signal data in the hardware processor's memory to be processed at some later time. The hardware processor memory includes stored executable programs executable by the hardware processor or a computer for performing the resilient restoration systems/methods, power distribution system operation data, and historical power distribution system data of the same type as the power distribution system and other data relating to the resilient restoration of the power distribution system or similar types of power distribution system s as the power distribution system.

Further, the signal data or other data may be received wirelessly or hard wired from a receiver 1046 (or external receiver 1038) or transmitted via a transmitter 1047 (or external transmitter 1039) wirelessly or hard wired, the receiver 1046 and transmitter 1047 are both connected through the bus 1056. The computer 1011 may be connected via an input interface 1008 to external sensing devices 1044 and external input/output devices 1041. For example, the external sensing devices 1044 may include sensors gathering data before-during-after of the collected signal data of the power distribution system. For instance, the disaster induced faulted line segments, and faulted types, and the fault impacted customers. The computer 1011 may be connected to other external computers 1042. An output interface 1009 may be used to output the processed data from the hardware processor 1040. It is noted that a user interface 1049 in communication with the hardware processor 1040 and the non-transitory computer readable storage medium 1012, acquires and stores the region data in the non-transitory computer readable storage medium 1012 upon receiving an input from a surface 1052 of the user interface 1049 by a user.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

We claim:

1. A system for a target image reconstruction, comprising:
   a stepped frequency transmitter configured to emit a stepped frequency waveform having different constant frequencies at different periods of time;
   a modulator configured to modulate the stepped frequency waveform emitted at each period of time with a modulation signal to output a modulated stepped frequency waveform with an increased bandwidth;
   a transceiver configured to transmit the modulated stepped frequency waveform to a target and to accept reflection of the modulated stepped frequency waveform reflected from the target;
   a mixer to interfere an unmodulated stepped frequency waveform output from the stepped frequency transmitter and the reflection of the modulated stepped frequency waveform to produce a beat signal of the interference of the unmodulated stepped frequency waveform with the reflection of the modulated stepped frequency waveform; and
   a signal processor to reconstruct an image of the target from the beat signal, wherein the signal processor is configured to
   reconstruct a low-resolution image for each stepped frequency of the unmodulated waveform to produce a set of low-resolution images;
   transform the set of low-resolution images with a Fourier transform to produce a set of Fourier transformations;
   join the set of Fourier transformations with respect to their corresponding stepped frequencies to produce a joined Fourier transformation; and
   transform the joined Fourier transformation with an inverse Fourier transform to produce the target image, wherein a resolution of the target image is greater than a resolution of each of the low-resolution images.

2. The system of claim 1, further comprising:
   a reference signal generator configured to generate a reference signal indicative of interference of the unmodulated stepped frequency waveform and the modulated step stepped frequency waveform, wherein the signal processor reconstructs the target image using the beat signal and the reference signal.

3. The system of claim 2, wherein the signal processor is a digital signal processor, wherein the beat signal is converted in a digital domain, wherein the reference signal generator comprises:
   an interferometer arranged to beat the unmodulated stepped frequency waveform and the modulated stepped frequency waveform to produce the reference signal; and
   a digitizer configured to convert the reference signal in the digital domain.

4. The system of claim 2, wherein the signal processor is a digital signal processor, wherein the beat signal is converted in a digital domain, wherein the reference signal generator is a digital generator constructing the beat signal in the digital domain using the modulation signal, the system impulse response, and a modulation sequence timing.

5. The system of claim 2, wherein the signal processor is configured to cross-correlate the beat signal and the reference signal in a frequency domain for each constant frequency of the unmodulated stepped frequency waveform to produce correlation signals, such that there is one correlation signal for each constant frequency;

combine the correlation signals in the frequency domain in an order of their respective frequencies to produce a frequency image of the target in the frequency domain; and transform the frequency image using a spatial Fourier transform to produce the target image.

6. The system of claim 1, wherein the stepped frequency transmitter is configured to emit the unmodulated stepped frequency waveform over a set of equidistant constant frequencies, wherein a distance between two adjacent frequencies is less than or equal to the bandwidth increased by the modulator.

7. The system of claim 1, wherein a portion of the modulated stepped frequency waveform of each constant frequency is transmitted over a fixed period.

8. The system of claim 1, wherein the stepped frequency transmitter includes a stepped frequency laser.

9. The system of claim 1, wherein the stepped frequency transmitter comprises:

a set of single-frequency lasers, each laser emits at a different frequency; and a switching mechanism to turn ON and OFF each laser at a corresponding period of time; and a switching clock to control switching timing and sequence.

10. The system of claim 1, wherein the stepped frequency transmitter comprises:

a tunable laser; and a tuning map specifying a set of inputs corresponding to a set of fixed frequencies of the unmodulated stepped frequency waveform; and a switching clock to control switching timing and sequence of the tunable laser.

11. The system of claim 1, wherein the stepped frequency transmitter includes one or multiple lasers emitting the stepped frequency waveform of light, wherein the mixer includes a first photo-receiver arranged to beat the unmodulated stepped frequency waveform and the reflection of the modulated stepped frequency waveform to produce a first digital signal of the interference; and a second photo-receiver arranged to beat the unmodulated stepped frequency waveform and the modulated stepped frequency waveform to produce a second digital signal, wherein the signal processor is a digital signal processor configured to reconstruct the target image using the first digital signal and the second digital signal.

12. The system of claim 11, wherein the digital signal processor configured to cross-correlate the first digital signal and the second digital signal in a frequency domain for each constant frequency of the unmodulated light to produce correlation signals, such that there is one correlation signal for each constant frequency;

combine the correlation signals in the frequency domain in an order of their respective wavelengths to produce a frequency image of the target in the frequency domain; and transform the frequency image using a spatial Fourier transform to produce an image of the target.

13. The system of claim 11, wherein one or both of the first photo-receiver and the second photo-receiver are phase-diverse coherent photo-receivers.

14. A method for a target image reconstruction, comprising:

emitting a stepped frequency waveform having different constant frequencies at different periods of time;

modulating the stepped frequency waveform emitted at each period of time with a modulation signal to output a modulated stepped frequency waveform with an increased bandwidth;

transmitting the modulated stepped frequency waveform to a target and accepting reflection of the modulated stepped frequency waveform reflected from the target;

interfering an unmodulated stepped frequency waveform and the reflection of the modulated stepped frequency waveform to produce a beat signal of the interference of the unmodulated stepped frequency waveform with the reflection of the modulated stepped frequency waveform;

generating a reference signal indicative of interference of the unmodulated stepped frequency waveform and the modulated stepped frequency waveform; and reconstructing an image of the target using the beat signal and the reference signal.

15. The method of claim 14, wherein the reconstructing comprises reconstructing a low-resolution image for each stepped frequency of the unmodulated waveform to produce a set of low-resolution images;

transforming the set of low-resolution images with a Fourier transform to produce a set of Fourier transformations;

joining the set of Fourier transformations with respect to their corresponding stepped frequencies to produce a joined Fourier transformation; and transforming the joined Fourier transformation with an inverse Fourier transform to produce the target image, wherein a resolution of the target image is greater than a resolution of each of the low-resolution images.

16. The method of claim 15, wherein the reconstructing comprises:

cross-correlating the beat signal and the reference signal in a frequency domain for each constant frequency of the unmodulated stepped frequency waveform to produce correlation signals, such that there is one correlation signal for each constant frequency;

combining the correlation signals in the frequency domain in an order of their respective frequencies to produce a frequency image of the target in the frequency domain; and transforming the frequency image using a spatial Fourier transform to produce the target image.

17. A system for a target image reconstruction, comprising:

a stepped frequency transmitter configured to emit a stepped frequency waveform having different constant frequencies at different periods of time, the stepped frequency transmitter comprising a set of single-frequency lasers, each laser emits at a different frequency, a switching mechanism to turn ON and OFF each laser at a corresponding period of time, and a switching clock to control switching timing and sequence;

a modulator configured to modulate the stepped frequency waveform emitted at each period of time with a modulation signal to output a modulated stepped frequency waveform with an increased bandwidth;

a transceiver configured to transmit the modulated stepped frequency waveform to a target and to accept reflection of the modulated stepped frequency waveform reflected from the target;

a mixer to interfere an unmodulated stepped frequency waveform output from the stepped frequency transmitter and the reflection of the modulated stepped frequency waveform to produce a beat signal of the interference of the unmodulated stepped frequency waveform with the reflection of the modulated stepped frequency waveform; and a signal processor to reconstruct an image of the target from the beat signal.

18. A system for a target image reconstruction, comprising:

a stepped frequency transmitter configured to emit a stepped frequency waveform having different constant frequencies at different periods of time, the stepped frequency transmitter comprising a tunable laser, a tuning map specifying a set of inputs corresponding to a set of fixed frequencies of the unmodulated stepped frequency waveform, and a switching clock to control switching timing and sequence of the tunable laser;

a modulator configured to modulate the stepped frequency waveform emitted at each period of time with a modulation signal to output a modulated stepped frequency waveform with an increased bandwidth;

a transceiver configured to transmit the modulated stepped frequency waveform to a target and to accept reflection of the modulated stepped frequency waveform reflected from the target;

a mixer to interfere an unmodulated stepped frequency waveform output from the stepped frequency transmitter and the reflection of the modulated stepped frequency waveform to produce a beat signal of the interference of the unmodulated stepped frequency waveform with the reflection of the modulated stepped frequency waveform; and a signal processor to reconstruct an image of the target from the beat signal.

\* \* \* \* \*